United States Patent [19]
Yamaguchi

[11] Patent Number: 5,955,906
[45] Date of Patent: Sep. 21, 1999

[54] NON-OVERLAPPING TWO-PHASE SIGNAL GENERATOR

[75] Inventor: Hiroshi Yamaguchi, Tokyo, Japan

[73] Assignee: NEC Corporation, Tokyo, Japan

[21] Appl. No.: 08/903,009

[22] Filed: Jul. 30, 1997

[30] Foreign Application Priority Data

Aug. 28, 1996 [JP] Japan ................................. 8-225762

[51] Int. Cl.⁶ ........................... H03B 27/00; H03K 3/037
[52] U.S. Cl. .................... 327/259; 327/295; 327/258; 327/239
[58] Field of Search ................................. 327/239, 259, 327/257, 258, 295, 172, 291, 296

[56] References Cited

U.S. PATENT DOCUMENTS 4,417,158 11/1983 Ito et al. ............................... 327/258

OTHER PUBLICATIONS by Deog–Kyoon Jeong et al., "Design of PLL–Based Clock Generation Circuits", *IEEE Journal of Solid–State Circuits*, vol. SC–22, No. 2, Apr. 1987, pp. 255–261.

*Primary Examiner*—Dinh Le
*Attorney, Agent, or Firm*—Young & Thompson

[57] ABSTRACT

A non-overlapping two-phase signal generator includes an oscillator to produce an oscillation signal of period 2t, a NAND (or NOR) gate, and a 2t-long time delay circuit. The output terminal of the oscillator is connected to one input terminal of the NAND (or NOR) gate; the output terminal of the NAND (or NOR) gate is connected to the input terminal of the delay circuit; and the output terminal of the delay circuit is connected to the other input terminal of the NAND (or NOR) gate. Non-overlapping two-phase signals appear at the output terminal of the delay circuit and at the output terminal of the NAND (or NOR) gate.

6 Claims, 5 Drawing Sheets

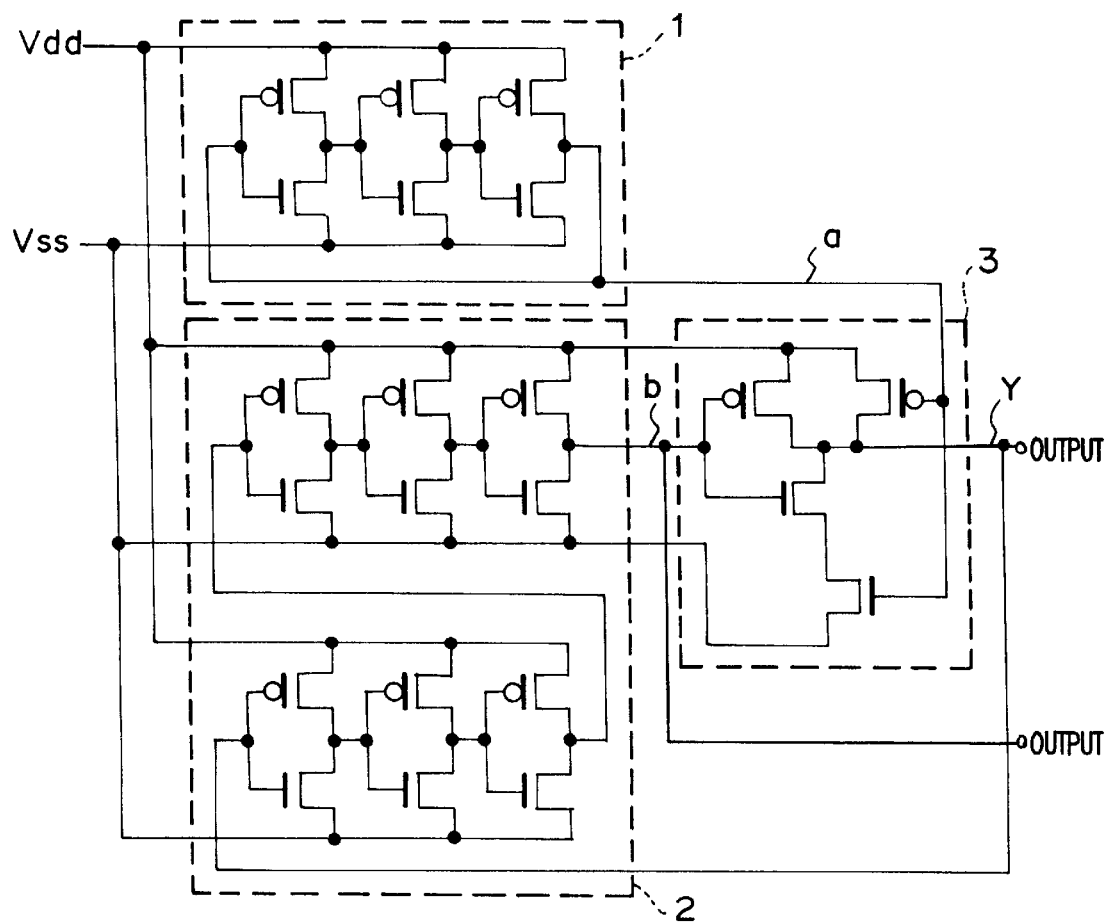
F I G . 2

NON-OVERLAPPING TWO-PHASE SIGNAL GENERATOR

BACKGROUND OF THE INVENTION

1. Field of the Invention

The present invention relates to a non-overlapping two-phase signal generator. A non-overlapping two-phase signal is composed of two trains of pulses with the pulses of one train not overlapping with those of the other train in time.

2. Prior Art

Japanese Patent Application Laid-Open No. 4-20,016 discloses one example of a non-overlapping three-phase signal generator. Referring to FIG. 4(A), it comprises a loop-like series connection of three delay circuits to form a ring oscillator 140. Each delay circuit comprises a MOS variable resistance circuit having an inverter INV11, INV12 or INV13 on its input side and a capacitor C11, C12 or C13 on its output side. Specifically, one electrode of each capacitor is connected to the MOS variable resistance circuit, and the other electrode is grounded. Each MOS variable resistance circuit is adapted to be controlled by complementary control signals Vin and inverted Vin. This ring-like arrangement forms a positive feed-back circuit in which the pre-inversion and the CR time delay produced by the capacitor and MOS variable resistor at each stage cause push-pull operations around the ring.

In this example, all circuit elements have the same characteristics: inverters INV11, INV12 and INV13 have the same logic threshold; capacitors C11, C12 and C13 have the same capacitance; and MOS variable resistances S11, S12 and S13 have the same characteristics. Three trains of pulses P1, P2 and P3 appear at the output terminals of the delay circuits. Due to the same characteristics of all circuit elements the waveform of each pulse train has the same duty and the same pulse-to-pulse duration as those of the other trains, as seen from FIG. 4(B).

The logic circuit 124 is responsive to these clock signals P1, P2 and P3 for producing non-overlapping three-phase clock pulses. It is composed of three AND gates 11, 12 and 13, which function according to the following logic equations:

$CP1 = P1 \cdot P2;$ $CP2 = P1 \cdot P3;$ and $CP3 = P2 \cdot P3.$

The clock pulses thus produced are shown in FIG. 4(B). As seen from FIG. 4(A), the output terminal of each delay stage is connected to AND gates selected in the logic circuit 124 via an associated buffer BUF11, BUF12 or BUF13.

Japanese Patent Application Laid-Open No. 5-100,768 discloses one example of a non-overlapping two-phase signal generator. Referring to FIG. 5(A), it comprises a reference clock signal generator 201 for generating reference clock signals at a frequency twice s high as clock signals, a first ½ frequency-divider 204 having a non-inversion circuit 202 associated therewith, a second ½ frequency-divider 205 having an inversion circuit 202 associated therewith, and a clock signal generator 206. Each ½ frequency-divider 204 or 205 is connected to the reference clock signal generator 201 to reduce the frequency of the reference clock signal to half, that is, the frequency of clock signals. The clock signal generator 206 is responsive to the signals from the ½ frequency dividers 204 and 205 for producing clock pulses in the form of non-overlapping two-phase signals. The duration or width of each clock pulse is composed of a variable section and a fixed section.

The clock signal generator 206 comprises: a first AND gate 63 of which one input terminal is connected to the first ½ frequency-divider 204 and of which the other input terminal is connected to the second ½ frequency-divider 205 via an associated inverter 62; a second AND gate 64 of which one input terminal is connected to the first ½ frequency-divider 204 via an associated inverter 61 and of which the other input terminal is connected to the second ½ frequency-divider 205; a first series of delay gates 65 connected to the output terminal of the AND gate 63; a second series of delay gates 66 connected to the output terminal of the AND gate 64; first OR gate 67, of which one input terminal is connected to the output terminal of the AND gate 63 and of which the other input terminal is connected to the output terminal of the first series of delay gates 65; and a second OR gate 68 of which one input terminal is connected to the output terminal of the AND gate 64 and of which the other input terminal is connected to the output terminal of the second series of delay gates 66. Clock pulses C1 and C2 appear at the output terminals of the first and second OR gates 67 and 68.

The AND gate 63 and 64 function to form the fixed section of clock pulse, of which the duration is equal to the reference pulse duration. On the other hand, the series of delay gates 65 and 66 function to form the variable section of clock pulse. The delays of gates 65 and 66 are determined during design stage. The delay of gates 65 and 66 vary because of the fluctuations of the voltage of power supply and temperature of gates and deviation of each gate. The OR gate 67 or 68 functions to form clock pulses C1 or C2 as an integration of these fixed and variable sections.

The number of delay gates is determined to provide a required amount of time delay in consideration of the delay amount in each gate, clock cycles and other designing factors.

With reference to FIG. 5(B), the operation of the circuit is described as follow. The signal names in FIG. (B) corresponds to those in FIG. 5(A).

First, the reference clock pulses C are generated by the oscillator 201 to be directed to both of the non-inversion circuit 202 and the inversion circuit 203. The non-inversion circuit 202 produces a time delay of the input signal as long as that produced by the inversion circuit 203. The non-inverted and inverted signals are directed to the ½ frequency-dividers 204 and 205 respectively, thus allowing the pulse signals Q1 and Q2 whose periods are twice as long as the reference clock signal C to appear at their output terminals. The pulse signal Q2 lags by the duration of reference pulse C behind the pulse signal Q1.

These pulse signals Q1 and Q2 are directed to the clock signal generator 206. Specifically, the pulse signal Q1 is directed to one input terminal of the AND gate 63, and at the same time to one input terminal of the AND gate 64 via the inverter 61. Likewise, the pulse signal Q2 is directed to the other input terminal of the AND gate 63 via the inverter 62, and at the same time to the other input terminal of the AND gate 64.

Then, the pulse signal R1 appears at the output terminal of the AND gate 63 to be directed to one terminal of the OR gate 67, and at the same time to the series of delay gates 65, thus causing the delayed pulse signal D1 to appear at the output terminal of the series of delay gates 65, and the delayed pulse signal D1 is applied to the other terminal of the OR gate 67. Finally the OR gate 67 produces clock signal C1 at its output terminal.

On the other hand, the pulse signal R2 appears at the output terminal of the AND gate 64 to be directed to one terminal of the OR gate 68, and at the same time to the series of delay gates 66, thus causing the delayed pulse signal D2 to appear at the output terminal of the series of delay gates 66, and the delayed pulse signal D2 is applied to the other terminal of the OR gate 68. Finally the OR gate 68 produces clock signal C2 at its output terminal.

As may be understood from the above, the reference clock signal C has a frequency twice as high as the clock signal C1 or C2, and the clock signal C2 lags by one cycle of the reference clock signal C behind the clock signal C1.

The circuit arrangement of FIG. 4 can provide non-overlapping three-phase signal CP1, CP2 and CP3, and can be modified to provide non-overlapping two-phase signal by selecting two signals among these three signals CP1, CP2 and CP3. The so selected signals, however, cannot have the same non-overlapping period. Also, there is an disadvantage that the delay time is determined by the product of resistance and capacitance, and therefore, the rises of the waveforms are not so sharp as to prevent appearance of whiskers on the clock pulse.

The circuit arrangement of FIG. 5 is complicated in structure, using so many circuit elements that it cannot work quickly. The resultant pulse width is determined as an integration of the reference clock pulse duration plus the delay amount provided by the delay circuit, and therefore, the settings of oscillation period, pulse duration, and non-overlapping period are difficult.

SUMMARY OF THE INVENTION

An object of the present invention is to provide a non-overlapping two-phase signal generator which is simple in structure, and operates at a high speed.

Another object of the present invention is to provide a non-overlapping two-phase signal generator which can be easily designed to provide pulse signals as desired in respect of oscillating period, pulse duration and non-overlapping period.

Still another object of the present invention is to provide a non-overlapping two-phase signal generator which can form sharp pulses and not cause whiskers to appear in the waveforms.

To attain these objects, a non-overlapping two-phase signal generator according to the present invention comprises oscillating means to produce an oscillation signal of a given period, NAND or NOR element means having two input terminals and one output terminal, and delay means to produce a time delay of an input signal as long as the given period of the oscillation signal; the output terminal of said oscillating means being connected to one input terminal of said NAND or NOR element means; the output terminal of said NAND or NOR element means being connected to the input terminal of said delay means; and the output terminal of said delay means being connected to the other terminal of said NAND or NOR element means, thus allowing non-overlapping two-phase signals to appear at the output terminal of said delay means and at the output terminal of said NAND or NOR element means.

The oscillating means may be a ring oscillator.

The oscillating means, the delay means and the NAND or NOR element means may be composed of CMOS transistors.

Other objects and advantages of the present invention will be understood from non-overlapping two-phase signal generators according to preferred embodiments of the present invention, which are shown in accompanying drawings:

BRIEF DESCRIPTION OF DRAWINGS

FIG. 2 shows some details of the circuit arrangement of FIG. 1(A);

DESCRIPTION OF PREFERRED EMBODIMENTS

Figure 1A:
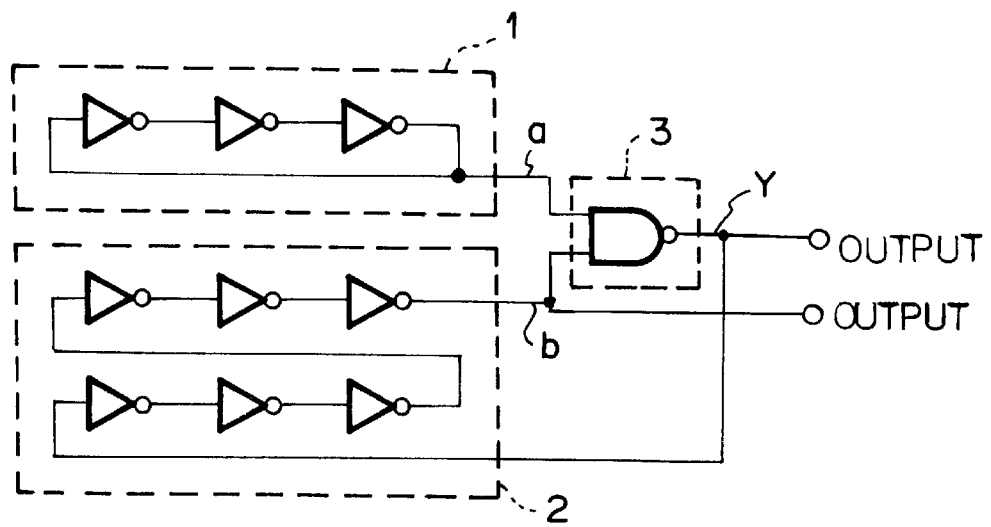
FIG. 1(A) shows a circuit arrangement according to a first embodiment of the present invention.

Referring to FIG. 1(A), a non-overlapping two-phase signal generator according to the present invention comprises a ring oscillator 1 to produce an oscillation signal of 2t-long period, a NAND circuit 3 having two input terminals and one output terminal, and a delay circuit 2 to produce a time delay of an input signal as long as the 2t-long period of the oscillation signal. The output terminal of the ring oscillator 1 is connected to one input terminal of the NAND circuit 3, and the output terminal of the NAND circuit 3 is connected to the input terminal of the delay circuit 2. The output terminal of the delay circuit 2 is connected to the other terminal of the NAND circuit 3. Non-overlapping two-phase signals appear at the output terminal of the delay circuit 2 and at the output terminal of the NAND circuit 3.

Figure 1B:
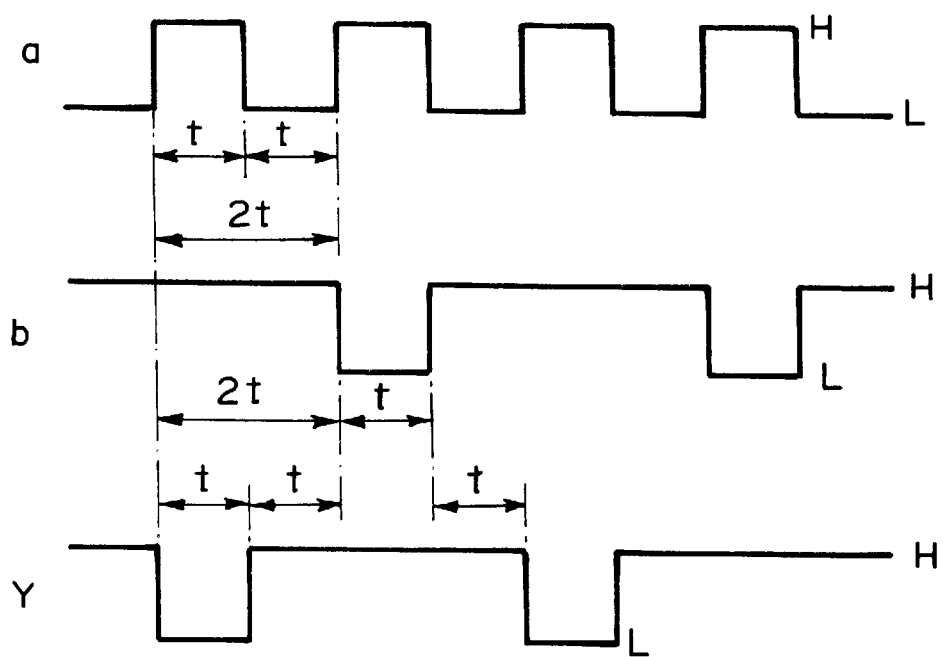
FIG. 1(B) shows waveforms appearing at selected places in the circuit arrangement of FIG. 1(A)

FIG. 1(B) shows waveforms of: the oscillation signal "a" of 2t-long period appearing at the output terminal of the ring oscillator 1; the delayed signal "b" appearing at the output terminal of the 2t-long time delay circuit 2; and the signal "Y" appearing at the output terminal of the NAND circuit 3.

As seen from FIG. 1(B), the ring oscillator 1 produces an oscillation signal "a" of 2t-long period, and the delay circuit 2 produces a 2t-long time delay of the input signal "Y", which appears at the output terminal of the NAND circuit 3. The pulse signal "b" appearing at the output terminal of the delay circuit 2 lags by a 2t-long time behind the pulse signal "Y" appearing at the output terminal of the NAND circuit 3. The negative-polarity pulses in the pulse train "b" and the negative-polarity pulses in the pulse train "Y" are available as non-overlapping two-phase signals, which appear at the output terminal of the delay circuit 2 and at the output terminal of the NAND circuit 3.

Since periods in which signal "a" remains HIGH and LOW are t, the cycle of signal "a" is 2t. Signal "Y" always takes value HIGH whenever signal "a" takes value LOW. Signal "b" becomes HIGH at time 2t after signal "Y" takes value HIGH. Because signal "b" becomes LOW at time 2t after signal "Y" becomes LOW, signal "Y" becomes HIGH at the time. Similarly, because signal "b" becomes HIGH at time 2t after signal "Y" becomes HIGH, signal "Y" becomes LOW at that time. These operations are periodically continued. Therefore, signal "Y" takes value LOW for period t in repetition period 4t, and value HIGH for period 3t. The value of signal "b" is equal to the value of signal "Y" delayed by time 2t.

As seen from waveforms "b" and "Y", these negative-polarity pulses have the same width (t) and the same repetition period (4t) in each pulse train. And these negative-polarity pulses appear in non-overlapping two-phase signal alternately after each lapse of t-long time (i.e., the same non-overlapping time).

FIG. 2 shows some details of the circuit arrangement of FIG. 1. They are composed of CMOS transistors. Specifically the oscillator 1 is composed of a series-connection of three inverters whose input and output terminals are connected together to form a ring oscillator (oscillation period being 2t long). The delay circuit 2 is composed of a series-connection of six inverters (delay period being 2t long).

The NAND circuit 3 is of an ordinary structure. Its input terminals are connected to the output terminals of the oscillator 1 and the delay circuit 2, and its output terminal is connected to the input terminal of the delay circuit 2.

Referring to FIG. 3, a non-overlapping two-phase signal generator according to a second embodiment is different from the first embodiment only in that a NOR gate 4 is used in place of the NAND gate.

Figure 3A:
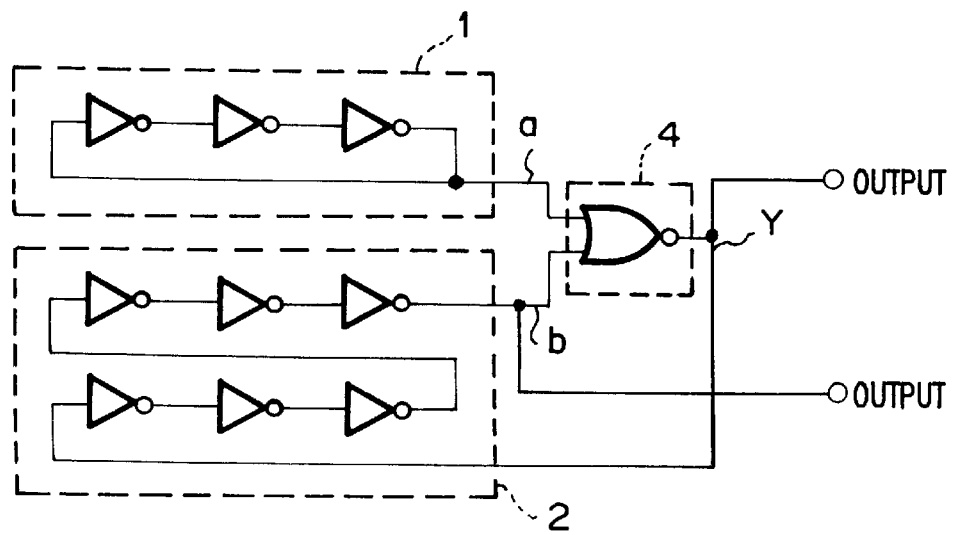
FIG. 3(A) shows a circuit arrangement according to a second embodiment of the present invention.
Figure 3B:
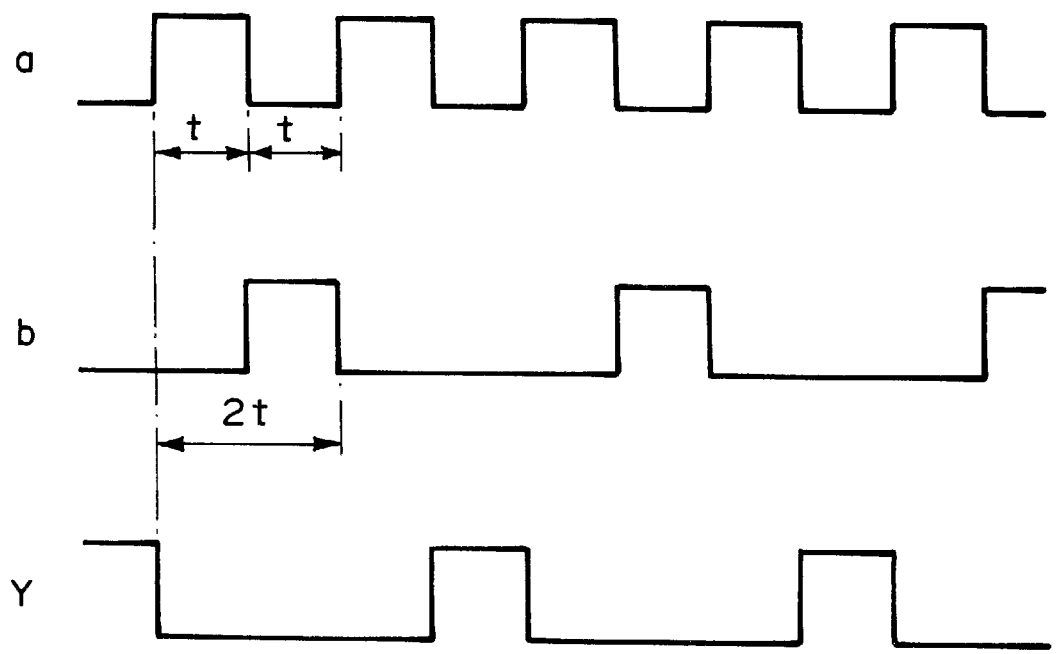
FIG. 3(B) shows waveforms appearing at selected places in the circuit arrangement of FIG. 3(A)
Figure 4A:
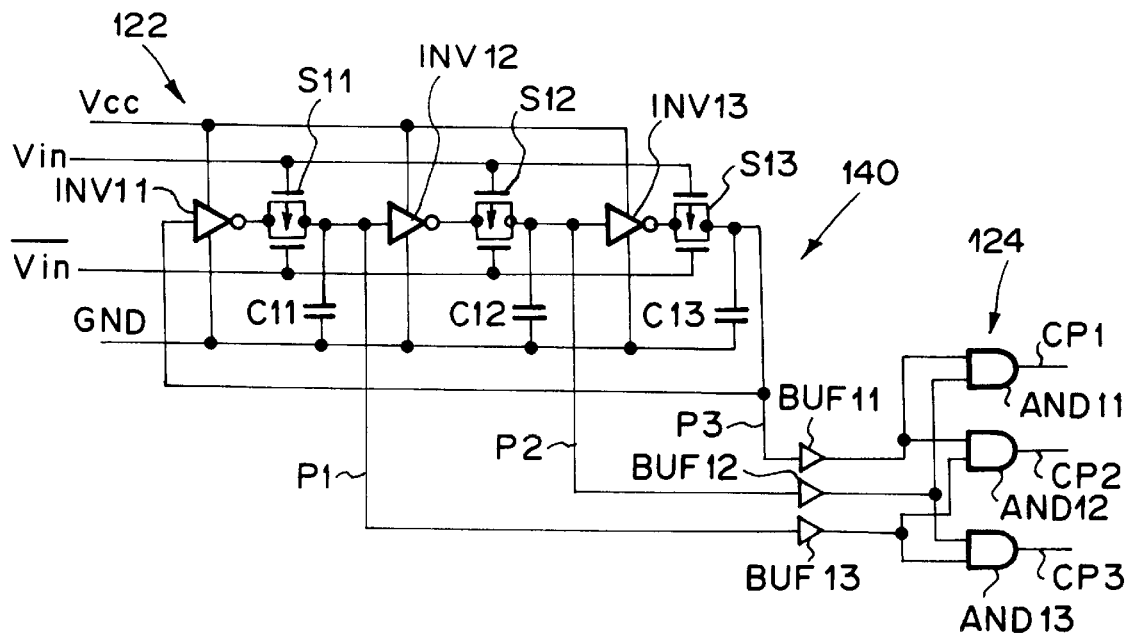
FIG. 4(A) shows a conventional non-overlapping three-phase signal generator.
Figure 4B:
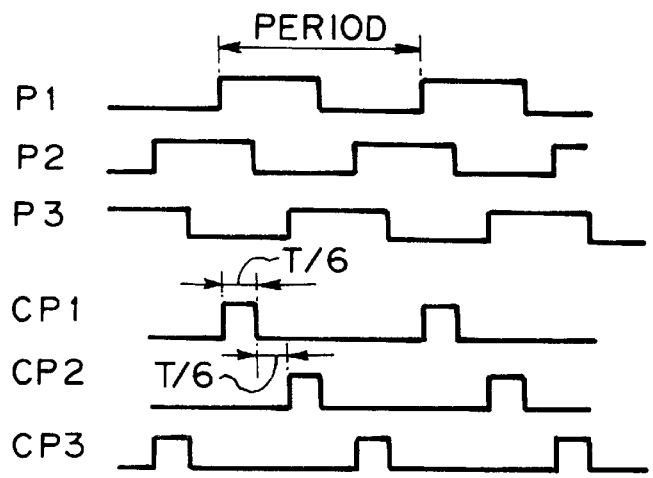
FIG. 4(B) shows waveforms appearing at selected places in the circuit arrangement of FIG. 4(A)
Figure 5A:
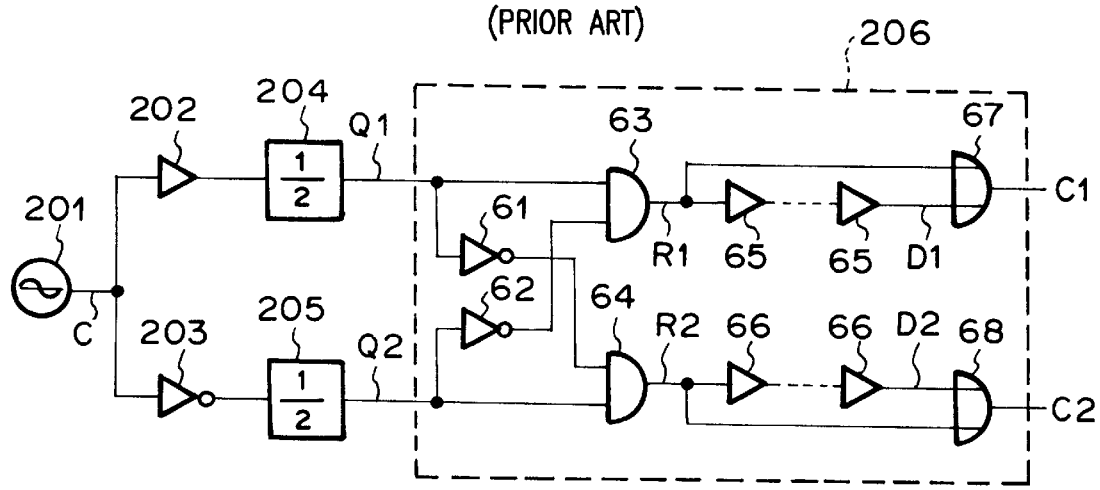
FIG. 5(A) shows another conventional non-overlapping two-phase signal generator.
Figure 5B:
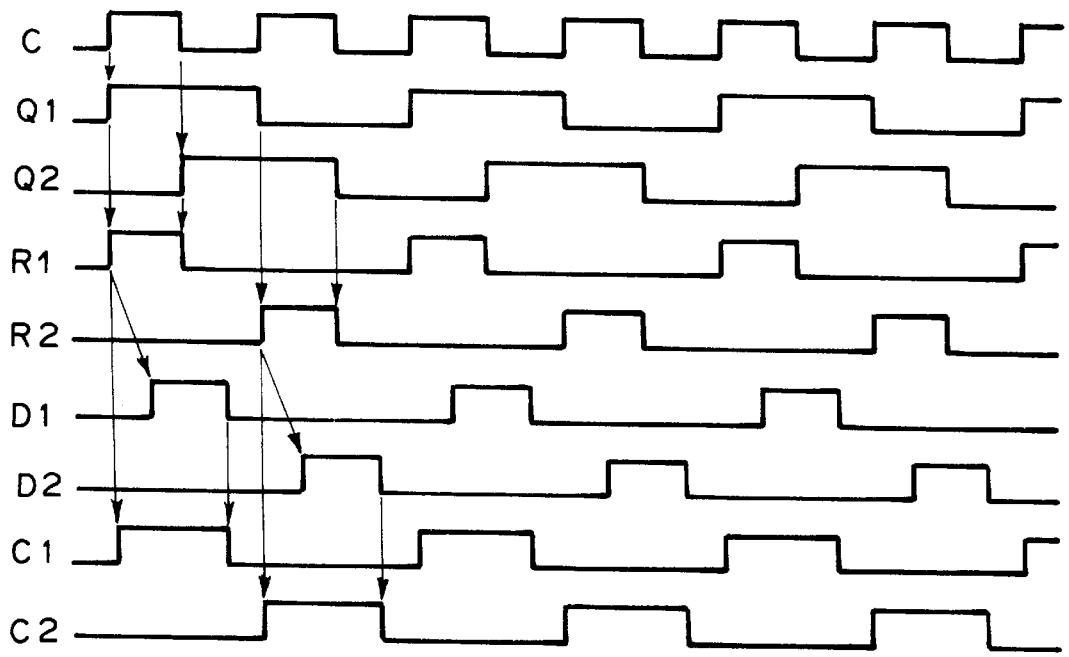
FIG. 5(B) shows waveforms appearing at selected places in the circuit arrangement of FIG. 5(A)

FIG. 3B shows waveforms "a", "b" and "Y" appearing at selected places indicated by the same letters in FIG. 3(A).

As seen from waveforms "b" and "Y", these positive-going pulses have the thee same width (t) and the same repetition period (4t) in each pulse train, and appear alternately after each lapse of t-long time in non-overlapping two-phase signal.

The circuit arrangement of FIG. 3(A) can be made up by using CMOS transistors only as in FIG. 2.

As may be understood from the above, there are advantages that a non-overlapping two-phase signal generator according to the present invention is composed of repetition of simple and the same circuit components, thereby allowing fast operation, and facilitating the designing and setting of the oscillating pulse width and period and the non-overlapping time; determination of the oscillation period necessarily leads to determination of pulse width and non-overlapping time in the non-overlapping two-phase signal.

Further, there are advantages that a nonoverlapping two-phase signal generator according to the present invention uses no resistor or capacitance in producing a time delay of a signal, thus providing a circuit which is robust to noise signals; multi-stage connection of inverters permits an appearance of sharp waveforms.

What is claimed is:

1. A non-overlapping two-phase signal generator comprising oscillating means for producing an oscillation signal having a period, a NAND having two input terminals and one output terminal, and delay means providing a time delay as long as the period of the oscillation signal; an output terminal of said oscillating means being connected to one input terminal of said NAND gate; the output terminal of said NAND gate being connected to an input terminal of said delay means; and an output terminal of said delay means being connected to the other input terminal of said NAND gate, wherein non-overlapping two-phase signals are generated at the output terminal of said delay means and at the output terminal of said NAND gate when the signal generator is operating.

2. The non-overlapping two-phase signal generator according to claim 1 wherein said oscillating means is a ring oscillator.

3. The non-overlapping two-phase signal generator according to claim 1 wherein said oscillating means, said delay means and said NAND gate are composed of CMOS transistors.

4. A non-overlapping two-phase signal generator comprising oscillating means for producing an oscillation signal having a period, a NOR element having two input terminals and one output terminal, and delay means for producing a time delay of an input signal as long as the period of the oscillation signal; an output terminal of said oscillating means being connected to one input terminal of said NOR element means; the output terminal of said NOR element means being connected to an input terminal of said delay means; and an output terminal of said delay means being connected to the other input terminal of said NOR element means, wherein non-overlapping two-phase signals are at the output terminal of said delay means and at the output terminal of said NOR element means when the signal generator is operating.

5. The non-overlapping two-phase signal generator according to claim 4 wherein said oscillating means is a ring oscillator.

6. The non-overlapping two-phase signal generator according to claim 4 wherein said oscillating means, said delay means and said NOR gate are composed of CMOS transistors.

* * * * *